(12) United States Patent
Doering et al.

(10) Patent No.: US 7,741,620 B2
(45) Date of Patent: Jun. 22, 2010

(54) MULTI-BEAM MODULATOR FOR A PARTICLE BEAM AND USE OF THE MULTI-BEAM MODULATOR FOR THE MASKLESS STRUCTURING OF A SUBSTRATE

(75) Inventors: Hans-Joachim Doering, Jena (DE); Joachim Heinitz, Isserstedt (DE)

(73) Assignee: Vistec Electron Beam GmbH, Jena (DE)

( * ) Notice: Subject to any disclaimer, the term of this patent is extended or adjusted under 35 U.S.C. 154(b) by 403 days.

(21) Appl. No.: 11/666,957

(22) PCT Filed: Oct. 25, 2005

(86) PCT No.: PCT/EP2005/055521

§ 371 (c)(1),
(2), (4) Date: May 2, 2007

(87) PCT Pub. No.: WO2006/048391

PCT Pub. Date: May 11, 2006

(65) Prior Publication Data

US 2008/0128638 A1 Jun. 5, 2008

(30) Foreign Application Priority Data

Nov. 3, 2004 (DE) .................. 10 2004 052 994

(51) Int. Cl.
*G21K 1/02* (2006.01)

(52) U.S. Cl. ............ 250/492.2; 250/492.1; 250/492.22; 250/396 R

(58) Field of Classification Search ............. 250/492.2, 250/492.1, 492.22, 396 R
See application file for complete search history.

(56) References Cited

U.S. PATENT DOCUMENTS

| 4,153,843 | A | | 5/1979 | Pease |
| 4,892,408 | A | * | 1/1990 | Pernick et al. ............... 356/400 |
| 5,144,142 | A | | 9/1992 | Fueki et al. |
| 5,369,282 | A | | 11/1994 | Arai et al. |

(Continued)

FOREIGN PATENT DOCUMENTS

DE 24 60 716 5/1976

OTHER PUBLICATIONS

J. Vac. Sci. Technol. B 15(6), Nov./Dec. 1997, pp. 2382 to 2386 "Programmable Aperture Plate for Maskless High-Throughput Nanolithography" by Berry et al.

*Primary Examiner*—David A Vanore
*Assistant Examiner*—Michael J Logie
(74) *Attorney, Agent, or Firm*—Frommer Lawrence & Haug LLP

(57) ABSTRACT

The invention discloses a multibeam modulator which generates a plurality of individual beams from a particle beam. The particle beam illuminates the multibeam modulator at least partially over its surface. The multibeam modulator comprises a plurality of aperture groups composed of aperture row groups. The totality of all aperture rows defines a matrix of m×n cells, where m cells form a row, and k openings are formed in each row. The density of openings within a row is inhomogeneously distributed.

22 Claims, 16 Drawing Sheets

U.S. PATENT DOCUMENTS

| | | |
|---|---|---|
| 5,430,304 A | 7/1995 | Yasuda et al. |
| 5,841,145 A * | 11/1998 | Satoh et al. ............ 250/492.22 |
| 6,014,200 A * | 1/2000 | Sogard et al. ................. 355/53 |
| 6,090,527 A | 7/2000 | Yamazaki et al. |
| 6,486,480 B1 * | 11/2002 | Leung et al. ........... 250/492.21 |
| 2003/0155534 A1 * | 8/2003 | Platzgummer et al. . 250/492.22 |
| 2003/0209676 A1 * | 11/2003 | Loschner et al. ......... 250/492.2 |
| 2004/0149935 A1 * | 8/2004 | Nakasugi ............... 250/492.22 |
| 2004/0192045 A1 * | 9/2004 | Leedy ........................ 438/689 |
| 2005/0104013 A1 * | 5/2005 | Stengl et al. ........... 250/492.21 |
| 2005/0242302 A1 * | 11/2005 | Platzgummer et al. . 250/492.22 |
| 2006/0076508 A1 * | 4/2006 | Nakasugi et al. ......... 250/491.1 |

\* cited by examiner

MULTI-BEAM MODULATOR FOR A PARTICLE BEAM AND USE OF THE MULTI-BEAM MODULATOR FOR THE MASKLESS STRUCTURING OF A SUBSTRATE

CROSS-REFERENCE TO RELATED APPLICATIONS

This application claims priority of International Application No. PCT/EP2005/055521, filed Oct. 25, 2005 and German Application No. 10 2004 052 994.9, filed Nov. 3, 2004, the complete disclosures of which are hereby incorporated by reference.

BACKGROUND OF THE INVENTION a) Field of the Invention

The invention is directed to a multibeam modulator for a particle beam. In particular, the invention is directed to a multibeam modulator which generates a plurality of individual beams from a particle beam. The particle beam illuminates the multibeam modulator at least partially over its surface. The multibeam modulator comprises a plurality of aperture groups, each aperture group having a plurality of aperture row groups. The totality of all aperture rows defines a matrix of m×n cells, where m cells form a row and k openings are formed in each row.

b) Description of the Related Art

The invention is further directed to the use of a multibeam modulator for maskless structuring of a substrate. In particular, a plurality of individual beams are generated by the invention in that a particle beam illuminates the multibeam modulator at least partially over its surface. A plurality of aperture groups are formed in the multibeam modulator, each aperture group having a plurality of aperture row groups. The totality of all aperture rows defines a matrix of m×n cells, where m cells form a row and k openings are formed in each row.

U.S. Pat. No. 4,153,843 discloses an exposure system with a plurality of beams. A two-dimensional array with a plurality of openings is provided in the beam path of an electron beam exposure system. The array is illuminated over its surface by the electron beam and is imaged in a reduced manner on a substrate. Only one individual aperture plate is provided generating the plurality of individual electron beams from the surface illumination. The individual openings are uniformly distributed over the aperture plate within a row.

U.S. Patent Application US 2003/0155534 A1 discloses a maskless exposure system for particle beams. A plurality of aperture plates which are fitted one behind the other generate a plurality of individual beams from an electron beam. The uppermost two plates and the bottom plate have openings through which the electron beam passes. Each plate has a thickness of about 100 µm and the plates have a distance from one another of 100 µm to 1 mm. An array of correction lenses is arranged between the second plate and the bottom plate in front of the final aperture plate. The density of openings within a row is constant.

U.S. Pat. No. 5,144,142 discloses a particle beam system containing an aperture plate for blanking corresponding partial beams. The individual aperture plate comprises m rows and n columns of openings which are arranged two-dimensionally on a substrate. A pair of deflecting electrodes is associated with each opening. Further, n×m-bit shift registers are provided on the substrate to supply the m pairs of deflecting electrodes with voltages corresponding to the pattern data. However, the aperture plate is formed only as an individual structural component part. Also, an inhomogeneous distribution of openings within a row is not suggested.

U.S. Pat. No. 5,369,282 discloses a particle beam system which generates a plurality of partial beams from a flat electron beam by means of an aperture plate, the partial beams being imaged on a substrate. A plurality of openings are formed in the aperture plate. The openings are homogeneously distributed over the aperture plate.

U.S. Pat. No. 5,430,304 discloses a particle beam system by which a plurality of partial beams are imaged on a substrate. There is also an aperture plate in which a plurality of switchable openings are formed. The openings are controlled by means of a corresponding quantity of shift registers. The distribution of the openings in the aperture plate is homogeneous.

The article "Programmable Aperture Plate for Maskless High-Throughput Nanolithography" by Berry et al., J. Vac. Sci. Technol. B 15(6), November/December 1997, pages 2382 to 2386, discloses a programmable aperture array comprising 3000×3000 apertures which can be electronically triggered and activated individually to monitor or control the passage of the beam. The pattern to be written is introduced into the aperture plate system as a binary signal from one side and is pushed through to the other side. The aperture plate system comprises an aperture plate with the corresponding deflecting electrodes. The openings are distributed in a correspondingly uniform fashion.

The publications cited above show multibeam modulators in the form of rows or arrays in which the triggering of each control element is carried out separately. However, because of the large quantity of leads, the number of beams operating in parallel is limited to about 1000 and enables only a moderate increase in productivity in spite of the extensive resources employed.

For this reason, it was proposed to use uniform or homogeneous array structures with n rows and m columns in which the on/off information in each row is advanced from one of the m modulator elements to the next by integrated delay elements or shift registers. The time shifting of the pixel image from column to column is correlated with a scanning movement of all beams relative to the substrate so that it is possible to use all of the n×m beams in parallel, but only new data for the n modulators of the first column need be provided in every exposure cycle. The main defect in known implementations of this principle is the limiting to one bit (on/off) per exposure cycle and row, so that mandatory dosing steps, proximity corrections, and the like can only be realized to a limited extent through the use of a plurality of arrays. Known solutions for the blanking chip require a high storage density and lack flexibility.

OBJECT AND SUMMARY OF THE INVENTION

It is the primary object of the invention to provide multibeam modulators for a particle beam for the maskless transfer of a layout to a substrate which can be directly electronically controlled and in which the multibeam modulator can be configured with respect to the minimum storage requirement of the electronic circuit, with respect to the temporal and spatial homogenization of the entirety of the beam, and with respect to beam-optical factors.

This object is met, in accordance with the invention, by a multibeam modulator which generates a plurality of individual beams from a particle beam. The particle beam illuminates the multibeam modulator at least partially over a surface thereof. The multibeam modulator comprises a plurality of aperture groups. Each aperture group is formed of aperture row groups in such a way that the totality of all aperture rows defines a matrix of m×n cells, wherein m cells form a row and k openings are formed in each row. The density of the openings within a row is inhomogeneously distributed.

A further object of the invention is the use of the multibeam modulator for the maskless structuring of substrates, wherein the multibeam modulator can be configured with respect to the minimum storage requirement of the electronic circuit, with respect to the temporal and spatial homogenization of the entirety of the beam, and with respect to beam-optical factors.

This object is met by a method of using a multibeam modulator for maskless structuring of substrates comprising the steps of generating a plurality of individual beams in that a particle beam illuminates the multibeam modulator at least partially over its surface, forming a plurality of aperture groups comprising aperture row groups in the multibeam modulator, defining the totality of aperture rows by a matrix of m×n cells, wherein m cells form a row and k openings are formed in each row, and inhomogeneously distributing the density of openings within a row.

The invention has the advantage that it avoids the elaborate, cost-intensive steps of producing exposure masks. However, the time-serial writing principle reduces the productivity of the exposure compared to parallel structure transfer using masks. Therefore, a line of development for maskless exposure devices consists in multiplying the effective writing speed though a large quantity of partial beams operating in parallel. The partial beams are arranged in the form of an array and can be switched on and off individually by a special modulation element (controllable beam sources, blanker, mirror). The present inventive solution describes the construction of a multibeam modulator based on row-oriented shift registers and its concept of dose control. The multibeam modulator can be configured with respect to the minimum memory requirement of the electronic circuit, with respect to the temporal and spatial homogenization of the entirety of the beam, and with respect to beam-optical and thermal factors. Further, it relates to proposed solutions enabling error redundancy and dose correction through the ability to reconfigure the control.

The multibeam modulator has the advantage that the density of openings within a row is distributed in an inhomogeneous manner. Extremes in the total current of all partial beams are prevented in this way. The openings within a row are equidistant, but the distance between the openings, expressed as a quantity of cells, is less than the quotient of the number of cells of a row and the number of openings within a row.

It is advantageous when the number k of openings within a row is between 64 and 71 or a multiple thereof. The cells of the multibeam modulator have a square shape and the dimensioning of the cells corresponds to a pixel to be written on the target multiplied by the imaging scale of the downstream optics. All of the openings of a row together with the cells therebetween form an aperture row. A plurality of aperture rows lying in the same X interval and a selected Y interval are combined to form aperture row groups. The aperture row groups also combine to form aperture groups and are uniformly arranged on a chip of an aperture plate. The aperture groups are separated by webs on which no structuring is carried out.

The subject matter of the invention is shown schematically in the drawings and is described with reference to the following figures.

DESCRIPTION OF THE PREFERRED EMBODIMENTS

Figure 1:
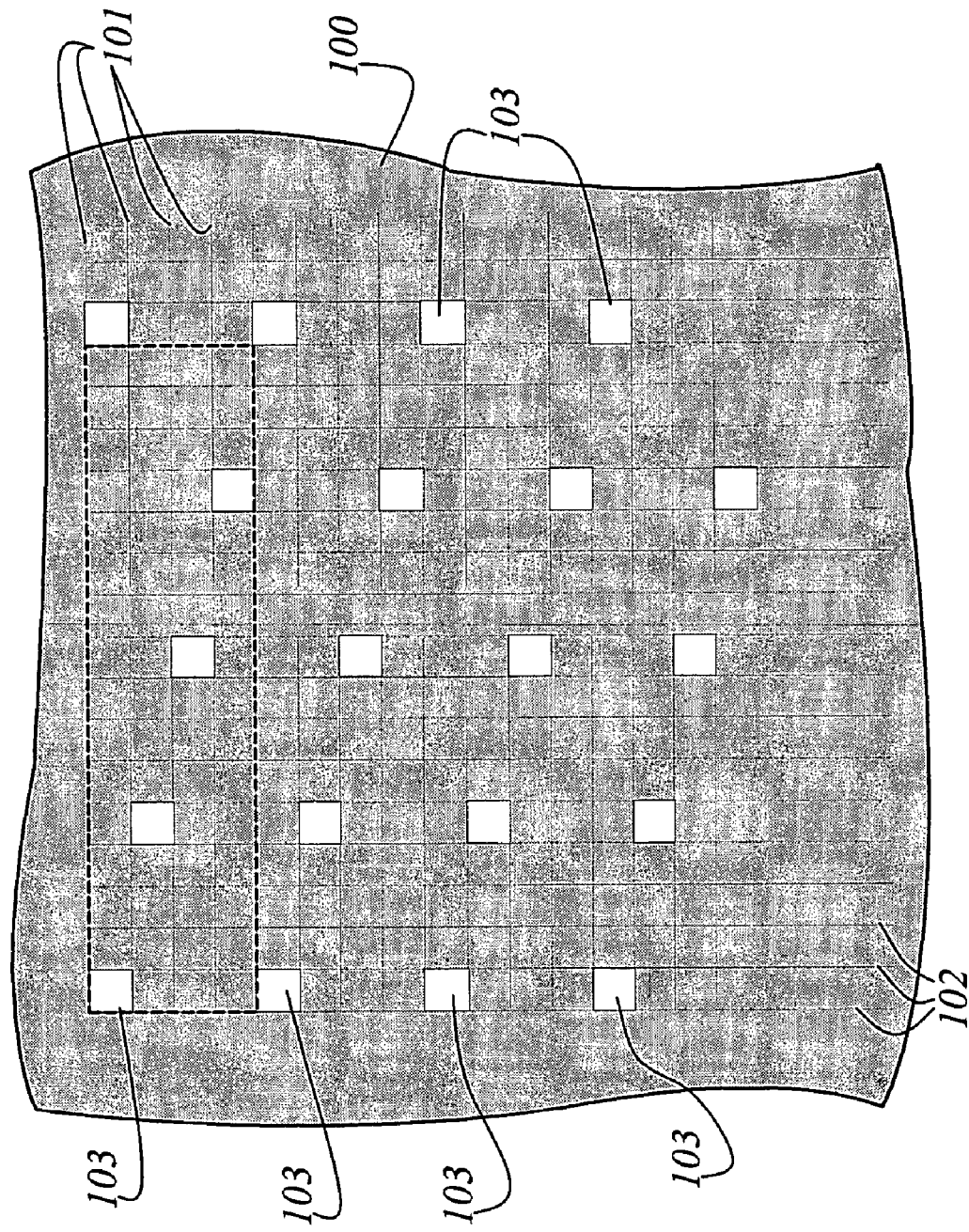
FIG. 1 shows an aperture plate according to the prior art.

FIG. 1 shows an aperture plate 100 according to the prior art. In this aperture plate 100, n rows 101 with m cells and m columns 102 with n cells are formed. In each row 101, a determined quantity k of openings 103 is formed. The openings 103 are distributed within a row such that the density of the openings 103 within a row is identical.

Figure 2:
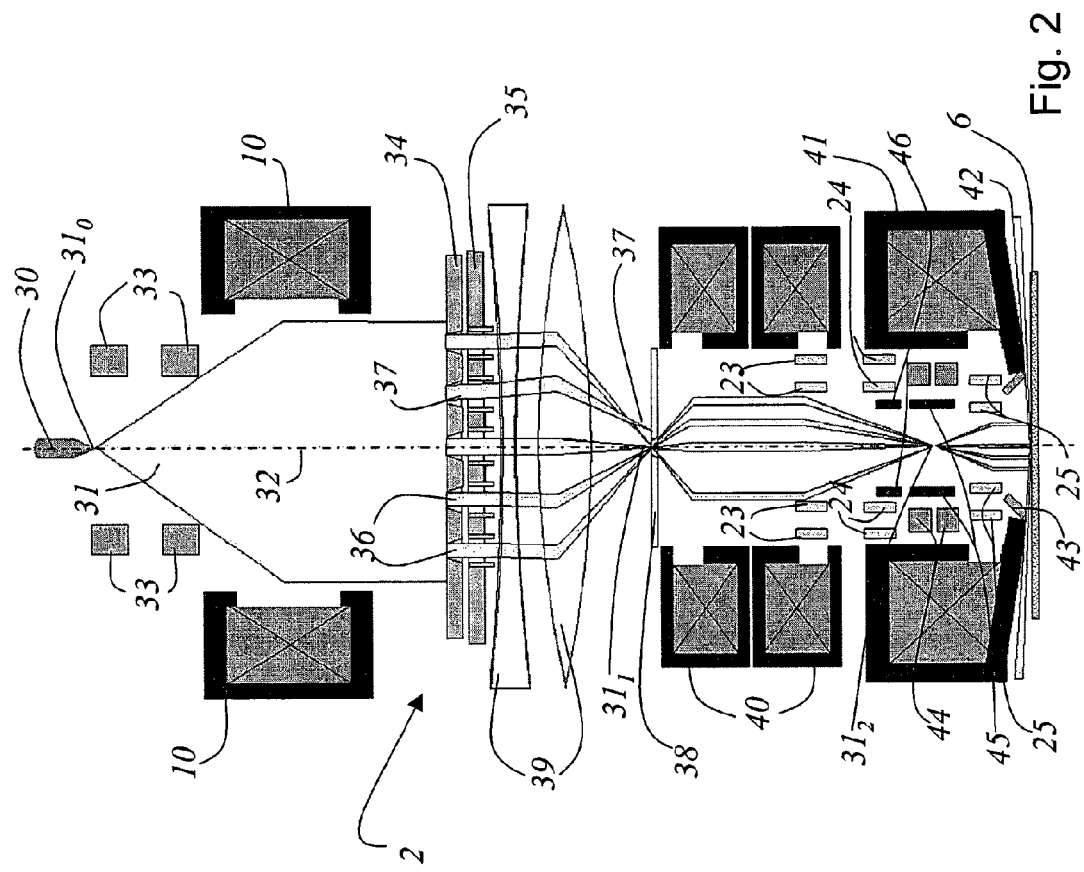
FIG. 2 is a schematic illustration of the construction of an entire system for electron beam lithography.

FIG. 2 shows a schematic view of the construction of a total system for maskless electron beam lithography. Although the following description is limited to electron beams, this should not be construed as a limitation of the invention. The invention is, of course, suited to all particle beams.

An electron beam 31 is generated by an electron gun 30 and propagates in direction of an electron-optical axis 32. The electrons exiting from the electron gun 30 have a source crossover $31_0$. Downstream of the electron gun 30 is a beam centering device 33 which orients the electron beam symmetrically around the optical axis 32. After the beam centering device, the electron beam 31 traverses a condenser system 10 which forms a parallel beam from the initially divergent electron beam 31. The beam that is shaped through the condenser system 10 has a diameter along which the intensity is homogeneously distributed. After the condenser system 10, a flat object 34 is provided. The flat object 34 is an aperture plate or an aperture plate system 50. The aperture plate system 50 is provided with a plurality of openings for generating many parallel beam bundles 36. A deflecting plate 35 having a plurality of beam deflecting units follows in the propagation direction of the beam bundles 36 in direction of the target 6. After the deflecting plate 35, there is an acceleration lens 39 which increases the energy of the electrons in the electron beam 31 and then generates a first intermediate image of the crossover $31_1$ at the location of the aperture diaphragm 38. All of the individual crossovers of the partial beam bundles 36 are formed at virtually the same location, namely, at the diaphragm opening of the aperture diaphragm 38. The diameter of the opening of the aperture diaphragm 38 is so selected that virtually all electrons of the undeflected beam bundles 36 can pass through the aperture diaphragm 38. Individual beams 37 that have undergone an individual change in direction through the deflecting plate 35 are stopped at the aperture diaphragm 38 because their crossover intermediate image does not occur at the location of the aperture diaphragm opening.

Continuing along the beam path, there now follows at least one magnetic lens 40 for imaging the aperture plate 34 on the target 6 in a reduced manner. In the present embodiment example, two magnetic lenses 40 are shown. A second intermediate image of the crossover $31_2$ is formed during the imaging. Before the undeflected beam bundles 36 impinge on the target 6, e.g., a wafer, they traverse an objective lens 41. The objective lens 41 is outfitted with a plurality of elements. Two deflecting devices 45 and 46 are provided before and after a second crossover $31_2$ of the electron beam 31. The deflecting devices 45 and 46 serve to deflect and determine the position of the electron beam 31 or the plurality of undeflected beam bundles 36 in the target 6. The two independently controllable deflecting systems 45 and 46 are advantageously used for separate optimal adjustment of slow and fast deflecting processes. Fast deflecting processes in the megahertz to gigahertz frequency range are required, for example, to maintain constant the position of the reduced aperture plate 34 on the steadily moving target 6 for the duration of an exposure step or exposure cycle by means of sawtooth-shaped deflections and, subsequently, to jump to the next exposure point within a very brief time. Since neighboring pixels are typically spaced by less than 100 nanometers, the fast deflecting system 46 is preferably constructed as an electrostatic system. A slow but highly accurate magnetic deflecting system 45 is preferably used to compensate for low-frequency positional deviations of the target 6 from the uniform movement in the range of several micrometers. Further, stigmators 44 are provided and are preferably constructed as multi-tiered magnetic coil systems to compensate for astigmatism and distortion caused by manufacturing tolerances and alignment errors in the optical column. The objective lens 41 has a scanning height measuring system 42 at the point of incidence of the electron beam on the target 6. The height measuring system 42 serves to detect unevenness in the target 6 (e.g., wafer) and height variations that can be caused by a displacing table. A detector 43 for the particles or electrons which are backscattered from the target 6 is located near the impingement point of the beam. This detector 43 serves to determine the position of marks on the target 6 for purposes of overlaying a plurality of exposure planes or for calibrating control elements of an exposure installation. Further, three pairs of correction lenses 23, 24, 25 are located in the lower region of the corpuscular beam device 2. The correction lenses 23, 24, 25 are used for dynamic correction of the focus, image field size and image field rotation during the exposure of the continuously moving target 6. The correction lens system 23, 24, 25 makes it possible to correct errors brought about by height variations in the target and by fluctuating space charges in the column area.

Figure 3:
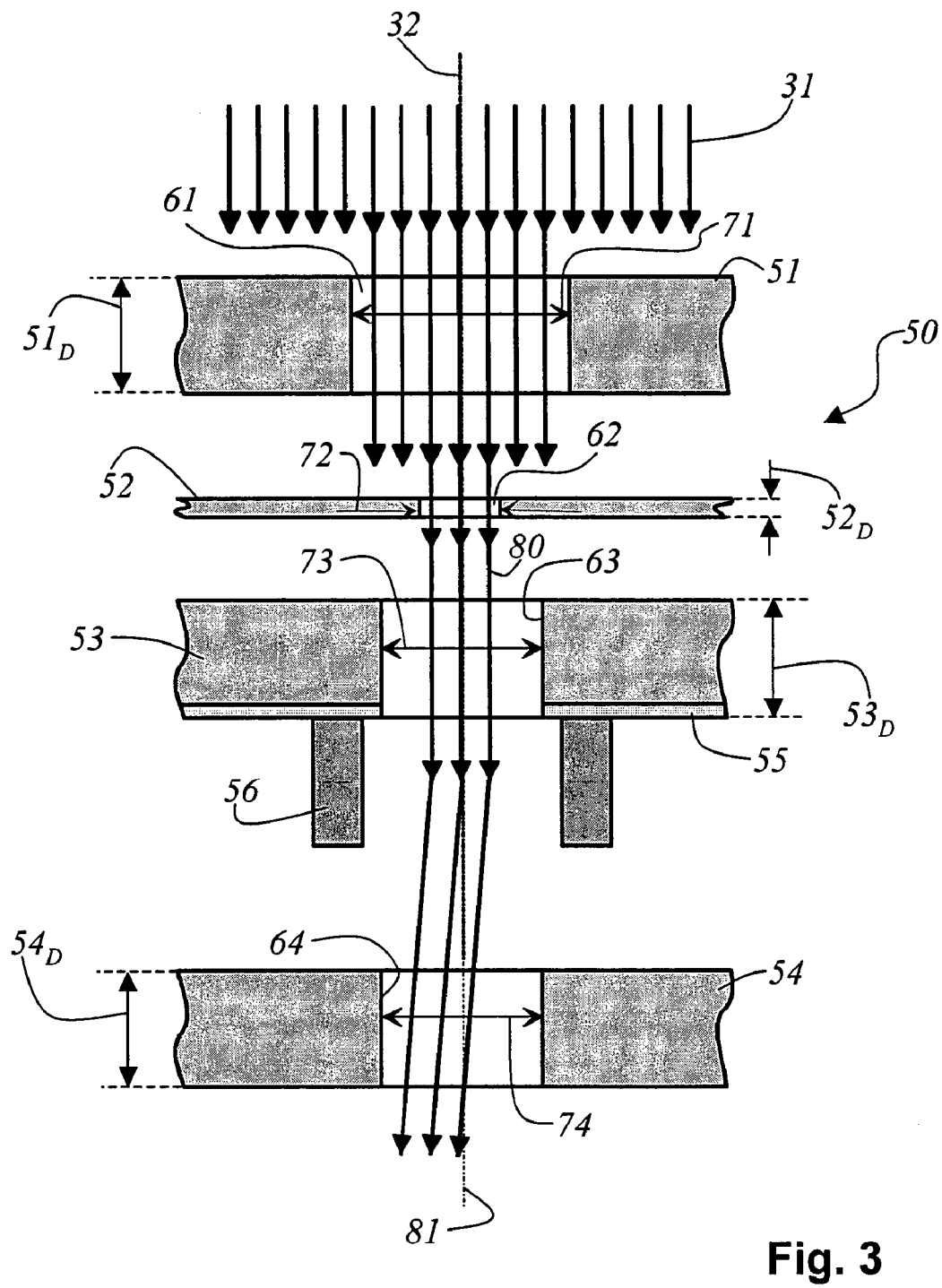
FIG. 3 is a schematic diagram showing the device for structuring a particle beam.

FIG. 3 shows a schematic view of a device 50 for structuring a particle beam 31. It should be noted that the particle beam 31 is equated with an electron beam. The device 50 for structuring the particle beam 31 comprises a first aperture plate 51, a second aperture plate 52, a third aperture plate 53 and a fourth aperture plate 54. The particle beam impinging in direction of the optical axis 32 illuminates the first aperture plate 51 over a large surface. A plurality of openings 61 having a substantially square cross section are formed in the first aperture plate 51. The first aperture plate 51 is made of silicon and has a thickness $51_D$ of about 20 μm to 100 μm. A second aperture plate 52 is arranged downstream of the first aperture plate 51. Openings 62 are likewise formed in the second aperture plate. The second aperture plate 52 is followed by a third aperture plate 53 in which a plurality of openings 63 are also provided. The third aperture plate 53 is followed by a fourth aperture plate 54 in which there are also a plurality of openings 64. All of the openings 61, 62, 63, 64 in the first aperture plate 51, second aperture plate 52, third aperture plate 53 and fourth aperture plate 54 have a square cross section. The opening 61 in the first aperture plate has a larger dimensioning 71 than the opening 62 in the second aperture plate 52. The aperture plate 52 following the first aperture plate 51 has a thickness $52_D$ of a few micrometers and the openings 62 have a highly precise square cross section. By highly precise is meant in this connection that the cross section maintains a tolerance of less than 100 nm for the absolute dimensional accuracy in x and y, and the corner acuity and edge roughness likewise conform to a tolerance of less than 100 nm. The openings 62 in the second aperture plate 52 have a dimensioning 72 that is smaller than the dimensioning 71 of the opening 61 in the first aperture plate 51. A typical ratio for the dimensions of the openings 71:72 is 2 . . . 3 assuming absolute measurements of 6 . . . 3 μm for the opening 62. As was already mentioned, the first aperture plate 51 is illuminated over its surface by the incident electron beam 31 and generates a plurality of partial beams through its openings 61, the cross sections of these partial beams corresponding to the cross section of the openings 61 in the first aperture plate 51. The first aperture plate 51 serves not only to generate a plurality of partial beams, but also to remove excess heat generated by the incident electron beam 31. The partial beams generated by the first aperture plate 51 impinge on the second aperture plate 52, and the openings 62 in the second aperture plate 52 generate the partial beam 80 of defined shape required for the imaging. The partial beam 80 of defined shape impinges on the third aperture plate 53 in which the openings 63 that are formed likewise have a larger dimensioning 73 than the openings 62 in the second aperture plate 52. On its side remote of the incident particle beam 31, the third aperture plate 53 has a control circuit 55 which generates the signals required for the deflection of the partial beam 80 of defined shape. The third aperture plate 53 has a thickness $53_D$ of approximately 20 μm to 100 μm. The fourth aperture plate 54 has a thickness $54_D$ of approximately 20 μm to 100 μm.

Also on the side of the third aperture plate 53 remote of the incident particle beam 31, a deflector 56 for the partial beam 80 of defined shape is associated with every opening 63. The third aperture plate 53 is followed by a fourth aperture plate 54 in which are likewise provided openings 64 having approximately the same dimensioning 74 as the openings 63 in the third aperture plate 53. The first aperture plate 51, the second aperture plate 52, the third aperture plate 53 and the fourth aperture plate 54 are arranged relative to one another in such a way that all openings 61, 62, 63, 64 are oriented along a center axis 81.

Figure 4:
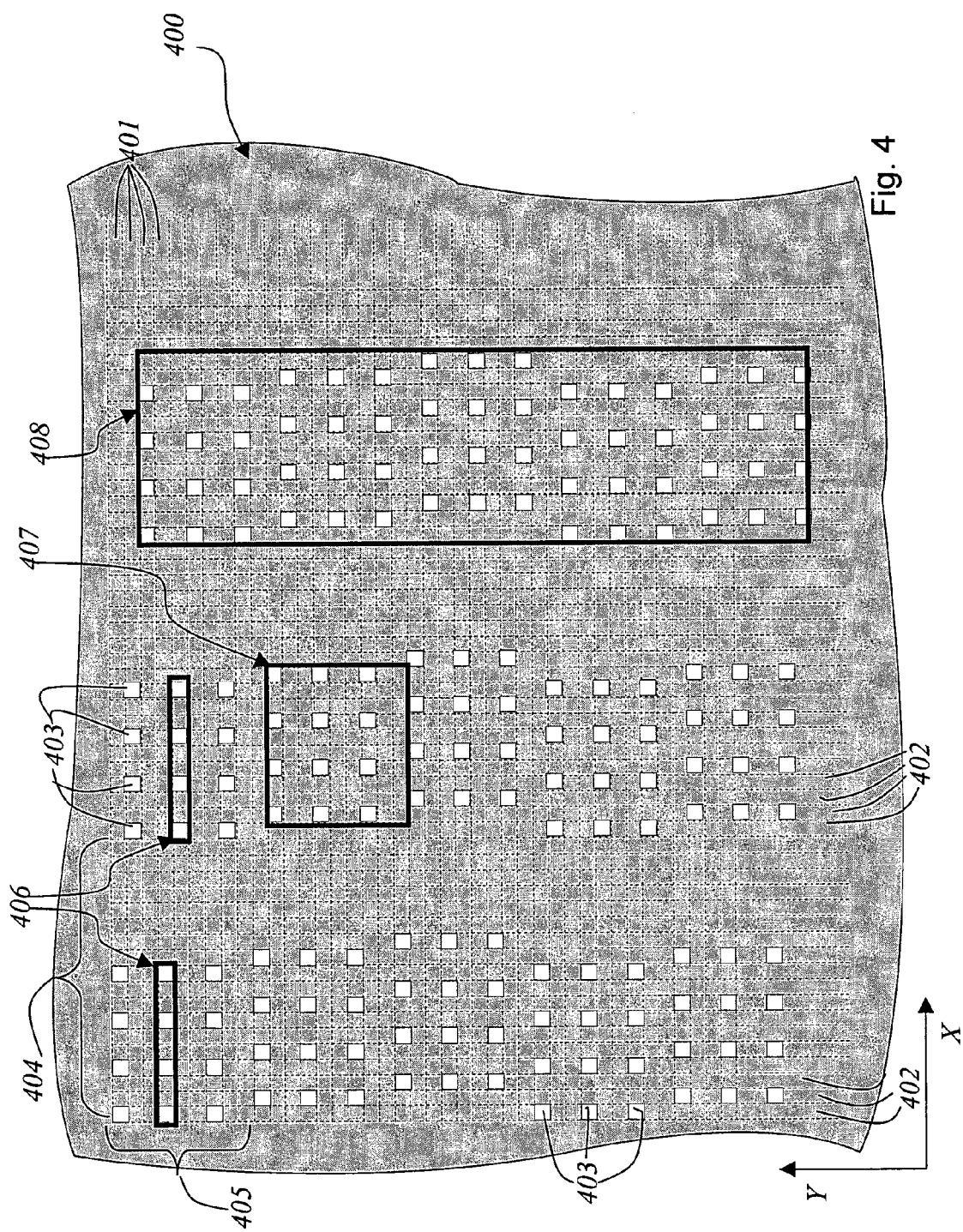
FIG. 4 shows a first embodiment form of the aperture plate according to the invention in which the openings in the aperture plate are distributed according to the inventive system.

FIG. 4 shows a first embodiment form of the aperture plate 400 according to the invention. The openings 403 in the aperture plate 400 are distributed based on the system according to the invention. There are n rows 401 with m cells and m columns 402 with n cells formed in the aperture plate 400. A determined quantity k of openings 403 is formed in each row 401. The openings 403 are distributed within a row in such a way that the density of the openings 403 is inhomogeneously distributed within a row 401. In the present embodiment example, the openings 403 are grouped within a row 401 in such a way that the distance between the openings 403 in a row 401 corresponds to two cells. The number of openings 403 in a row 401 is four. The number of cells within a row 401 is greater than the number of openings 403 approximately by a factor of at least 10. The four openings 403 are distributed in such a way that every third cell is an opening 403. The aperture row offset 404 is eighteen cells in X-direction, i.e., two aperture rows 406 lying next to one another in X-direction are offset in each instance by eighteen cells. An aperture row subgroup 407 comprises three aperture rows 406. Aperture row groups 408 are formed by a plurality of aperture row subgroups 407 adjoining one another in Y-direction. Aperture rows 406 lying next to one another in X-direction always belong to different aperture row groups and have a Y-offset of at least one cell.

Figure 5:
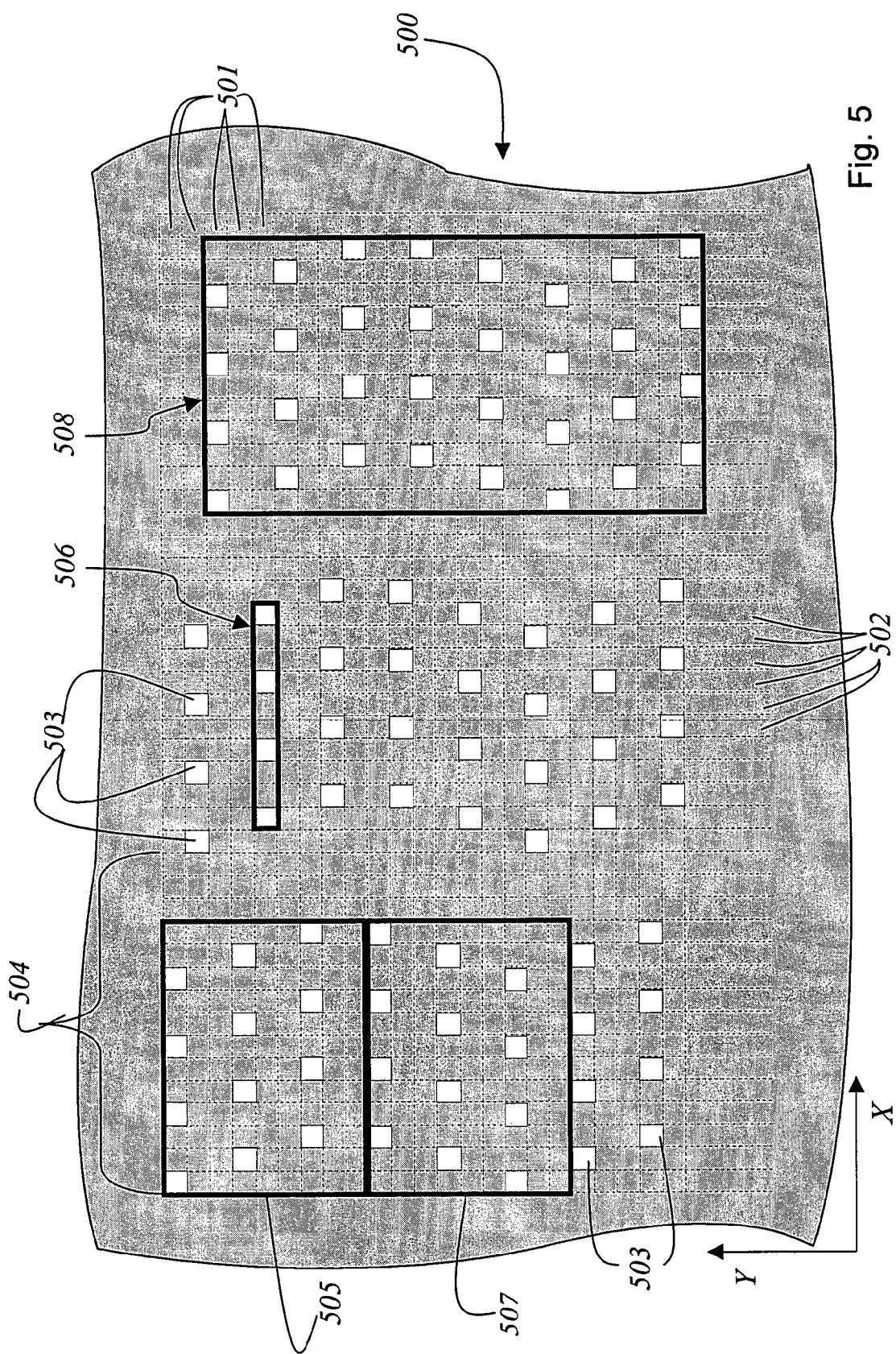
FIG. 5 shows a second embodiment form of the aperture plate in which the openings are distributed in the aperture plate according to the inventive system.

FIG. 5 shows a second embodiment form of the aperture plate 500 according to the invention. The openings 503 in the aperture plate 500 are distributed based on the system according to the invention. There are n rows 501 with m cells and m columns 502 with n cells formed in the aperture plate 500. A determined quantity k of openings 503 is formed in each row 501. The openings 503 are distributed within a row in such a way that the density of the openings 503 is inhomogeneously distributed within a row 501. In the present embodiment example, the openings 503 are grouped within a row 501 in such a way that the distance between the openings 503 in a row 501 is two cells. The number of openings 503 in a row 501 is four. The number of cells within a row 501 is greater than the number of openings 503 approximately by a factor of at least 10. The four openings 503 are distributed in such a way that every third cell is an opening 503. The aperture row offset 504 is fifteen cells in X-direction, i.e., every two adjacent aperture subgroups 505, 507 are offset in X-direction by fifteen cells. In the present embodiment example, a first aperture row subgroup 505 alternates with a second aperture row subgroup 507. Both the first aperture row subgroup 505 and the second aperture row subgroup 507 comprise three aperture rows 506. The first aperture row subgroup 505 is formed in such a way that the first row 501 of the first aperture row subgroup 505 starts with an opening 503. The second aperture row subgroup 507 is formed in such a way that the first row 501 starts at the third cell with an opening 503.

The variant implementations described above are suggested on the basis of the proposed distribution of the openings 403, 503 and, consequently, also of the modulator elements, where all k modulator elements of every row 401, 501 are arranged directly one behind the other at the shortest possible distance of p-times the partial beam width (p=4 ... 8) resulting in the shortest possible aperture row length. In each instance, p aperture row groups are arranged so as to be offset in X-direction, and the offset corresponds to an integral multiple of the partial beam width and is greater than the aperture row length. A repeated arrangement of aperture row subgroups 407 and 505, 507 offset orthogonal to the row direction results in aperture row groups making up the complete aperture array (see FIGS. 4 and 5).

Since the dose information need only be held in abbreviated rows, namely, the aperture rows, the total storage density is reduced by the factor p. Further, the blurring of a determined pixel on the substrate that is caused by the superposition of various distortions to which the individual apertures of an aperture row are subject when imaging on the target is reduced due to the close proximity of all of the openings 403, 503 and consequently also of all of the modulator elements in every row 401, 501. It is also possible to correct residual distortion errors which can arise from fabrication, for example, and which have been determined. This likewise results in an improved lithographic resolution.

The heart of the suggested device 50 is the aperture plate system, wherein deflectors or modulator elements (see FIG. 3) are associated with the openings 403, 503 when there is at least one active aperture plate 53. In this connection, the invention does not make use of a predetermined, uniform array of openings 403, 503 or deflectors. The density of the openings 403, 503 within a row 401, 501 is not uniformly distributed along the row 401, 501. The deflectors or modulator elements comprise n shift registers of length m. This results in a multibeam modulator that is dependent on the various physical and technical boundary conditions.

Figure 6:
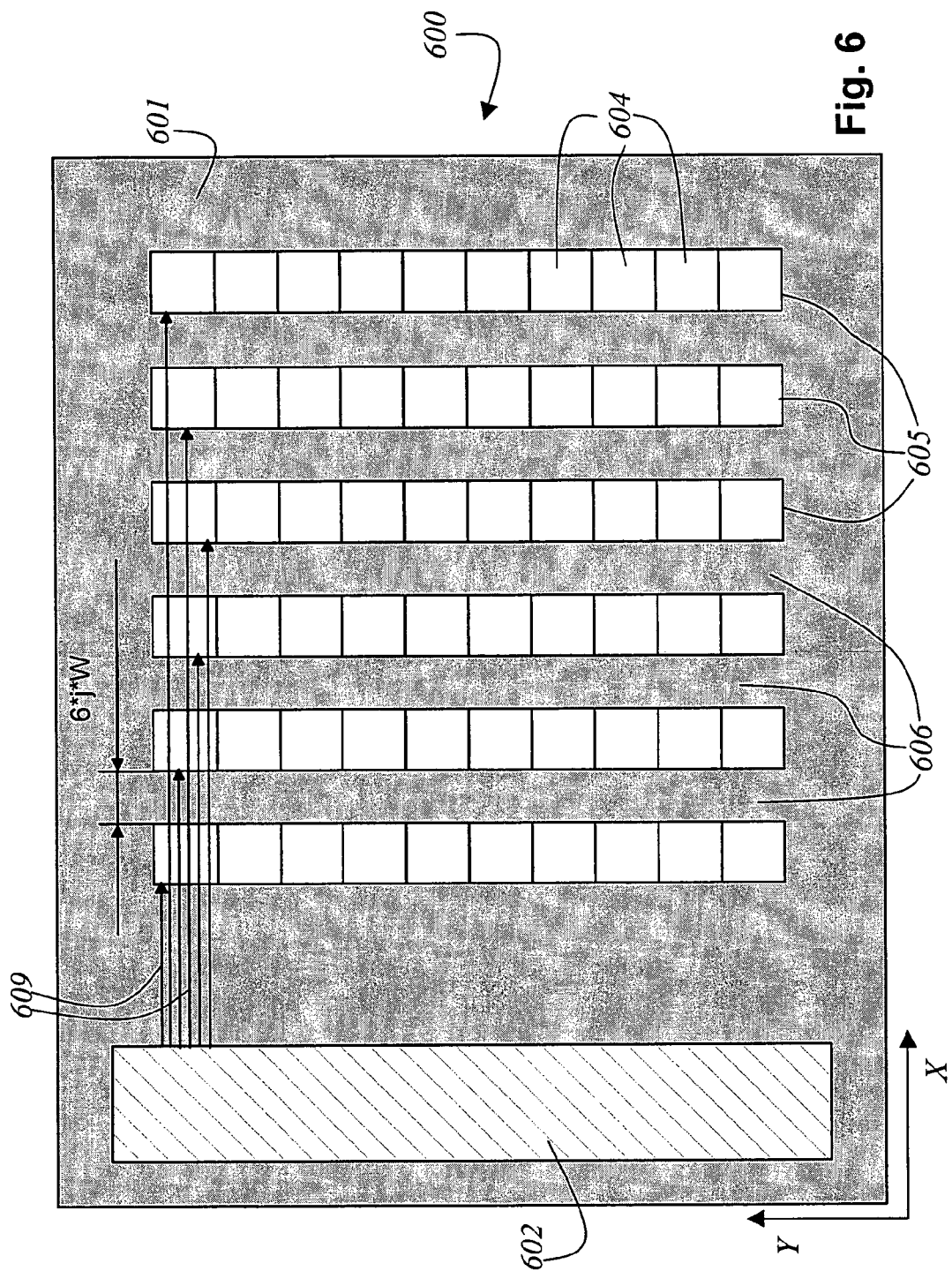
FIG. 6 is a schematic view of an active aperture plate according to an embodiment form in which the aperture groups are configured on a chip.

FIG. 6 shows a schematic view of a complete active aperture plate 600 according to an embodiment, form. The size of a chip 601 on which the aperture plate 600 is realized is 33 mm×26 mm. Control electronics 602 are also provided on the chip 601. The aperture row groups 604 which are arranged on the aperture plate 600 in an X-line 605 are separated by webs 606. No structuring by aperture row groups is carried out in the webs 606. The six aperture row groups in every X-line 605 have a Y-offset of 1 to 5 cells relative to one another so that the openings of the aperture rows of every aperture row group are positioned in different rows. In the embodiment example shown in FIG. 6, the number k of openings in every aperture row is 64. The distance between two openings within a row is five cells or pitch distance p (p=6). The aperture row offset in X-direction X can be, e.g., $X = 384\,W + 6 \times j \times W$, where $6 \times j \times W$ is the width of the web 606 between the aperture row groups 605 arranged in a line. W stands for the dimensioning of the openings or cells and j is a whole number. An aperture row group 604 can have, e.g., 64 aperture rows which are offset respectively by 6 W in Y-direction. Accordingly, all of the 60 aperture row groups 604 shown in the drawing together contain 3840 aperture rows with 64 openings, respectively. For reasons of efficient data transmission, it may be useful to increase the quantity of aperture rows, e.g., to 4096, which can be carried out by arranging additional aperture row groups or by increasing the quantity of aperture rows per aperture row group. Electric lines 609, shown schematically, connect the control electronics to the respective shift register of every aperture row which shifts the gray value information in a timed manner from cell to cell through the aperture row.

Figure 7:
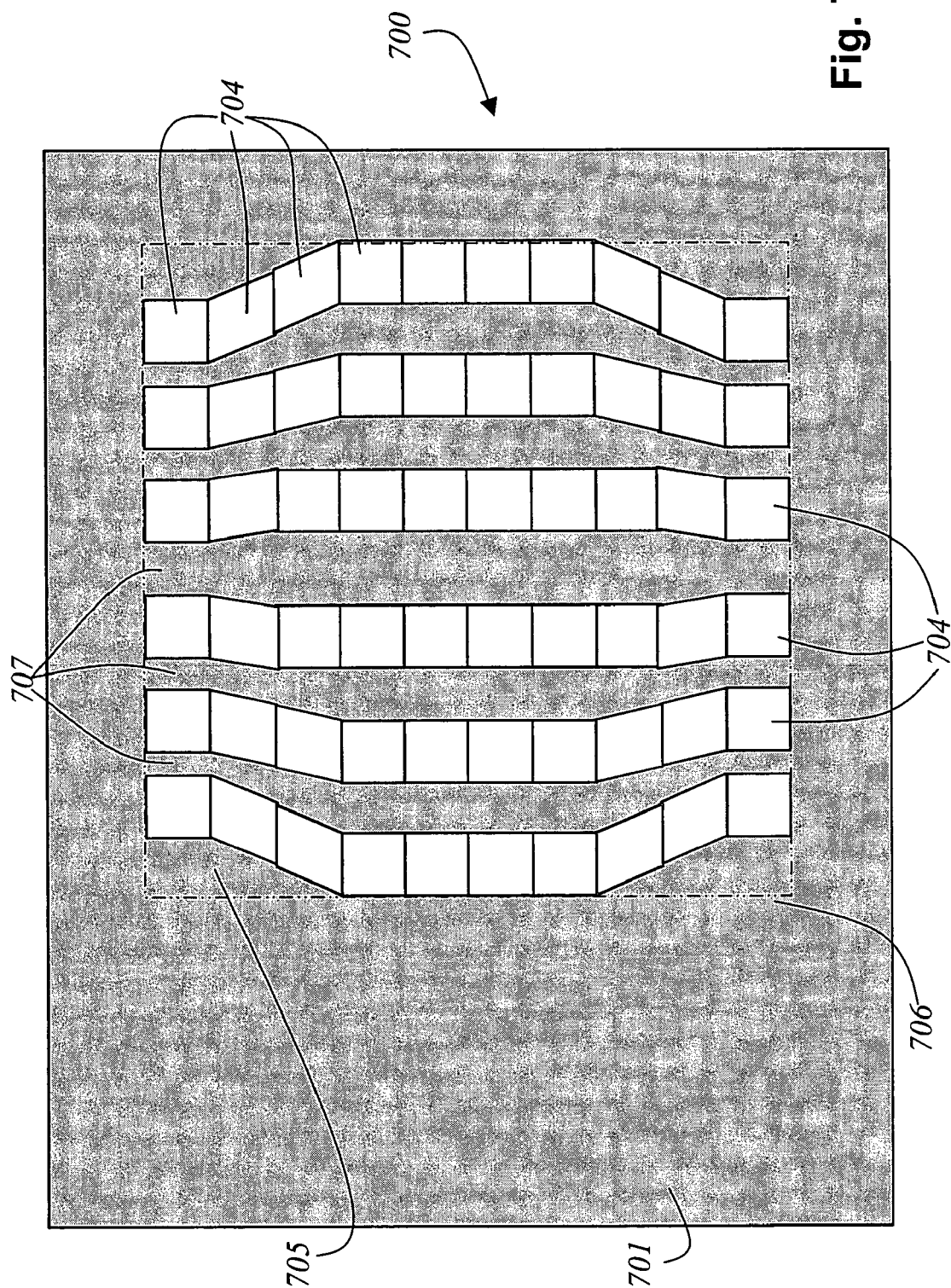
FIG. 7 shows a schematic view of an active aperture plate according to another embodiment form in which the aperture groups are configured on a chip.

FIG. 7 is a schematic view showing a complete active aperture plate 700 according to another embodiment form. The size of a chip 701 on which the aperture plate 700 is realized is 33 mm×26 mm. Control electronics (not shown) are provided on the chip 701 in a manner analogous to FIG. 6. The individual aperture row groups 704 are arranged on the chip 701 of the aperture plate 700 in such a way that the distance 707 between the individual aperture row groups 704 is reduced in the corner regions 705 of a rectangle 706 drawn around the arrangement of individual aperture row groups. No structuring by aperture row groups 704 is carried out in the spaces 707 between the aperture row groups 704. In the embodiment example shown in FIG. 7, the number k of openings in every aperture row is 64. The distance between two openings within a row is five cells or pitch distance p (p=6). The aperture row offset in X-direction X can be, e.g., X=384 W+6×j×W, where 6×j×W is the maximum distance 707 between the successive aperture row groups 704. An aperture row group 704 can have, e.g., 64 aperture rows which are offset respectively by 6 W in Y-direction. Accordingly, all of the sixty aperture row groups 704 shown in the drawing together contain 64 openings, respectively.

Figure 8:
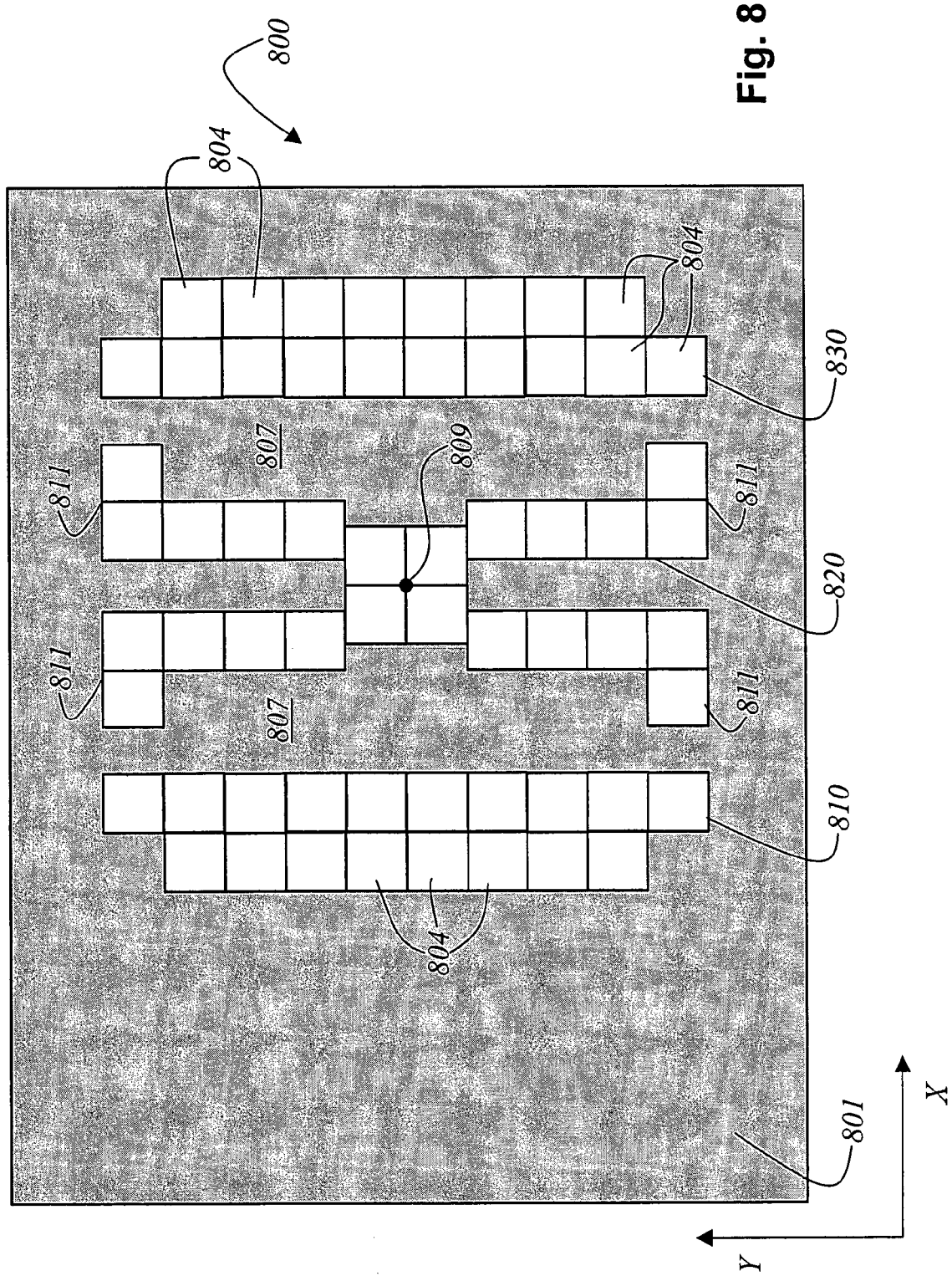
FIG. 8 shows a schematic view of an active aperture plate according to another embodiment form in which the aperture groups are configured on a chip.

FIG. 8 is a schematic view showing a complete active aperture plate 800 according to another embodiment form. The size of a chip 801 on which the aperture plate 800 is realized is 33 mm×26 mm. Control electronics (not shown) are provided on the chip 801 in a manner analogous to FIG. 6. The individual aperture row groups 804 are arranged on the chip 801 of the aperture plate 800 so as to be divided into a first aperture group 810, a second aperture group 820, and a third aperture group 830. The individual aperture row groups 804 of the first aperture group 810, second aperture group 820 and third aperture group 830 are arranged in such a way that the individual aperture row groups of every aperture group directly adjoin one another. The individual aperture groups 810, 820, 830 are separated from one another on the chip by unstructured areas 807. The second aperture group 820 is formed in such a way that four aperture row groups 804 are arranged around the center of symmetry 809 of the second aperture group 820. Four L-shaped arrangements 811 of aperture row groups adjoin the four central aperture row groups 804. The short legs of the Ls face outward. In the embodiment example shown in FIG. 8, the number k of openings in every aperture row is 64. The distance between two openings within a row is five cells or pitch distance p (p=6). An aperture row group 804 can have, e.g., 64 aperture rows which are offset by 6 W in Y-direction.

Figure 9:
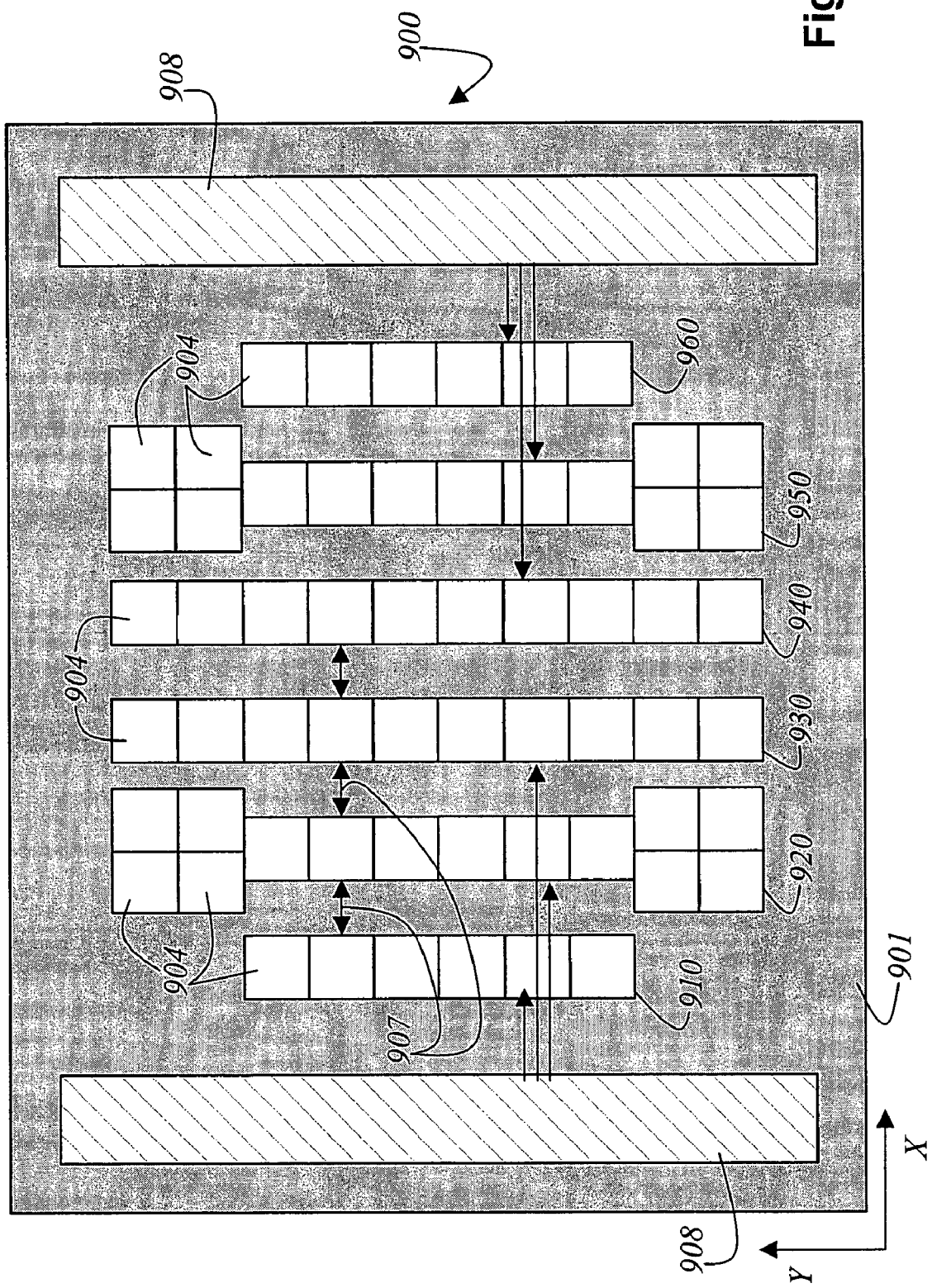
FIG. 9 shows a schematic view of an active aperture plate according to another embodiment form in which the aperture groups are configured on a chip.

FIG. 9 is a schematic view showing a complete active aperture plate 900 according to another embodiment form of the invention. The size of a chip 901 on which the aperture plate 900 is realized is 33 mm×26 mm. The chip 901 is formed symmetrically and has control electronics 908, respectively, at opposite sides. The individual aperture row groups 904 are arranged on the chip 901 of the aperture plate 900 in six aperture groups 910, 920, 930, 940, 950, 960. The shape of the arrangement of individual aperture groups 910, 920, 930, 940, 950, 960 is substantially linear. The individual aperture groups 910, 920, 930, 940, 950, 960 also have the same distance 907 from one another. The third and fourth aperture groups 930, 940 have a number H of linearly arranged aperture row groups 904. The second and fifth aperture groups 920, 950 have four aperture row groups 904 arranged in a square at the respective opposite ends of the linear arrangement of aperture groups 920, 950. The first and sixth aperture groups 910, 960 have a number H-4 of linearly arranged aperture row groups 904. In the embodiment example shown in FIG. 9, the number k of openings in every aperture row is 64. The distance between two openings within a row is five cells or pitch distance p (p=6). An aperture row group 904 can have, e.g., 64 aperture rows which are offset by 6 W in Y-direction.

Figure 10:
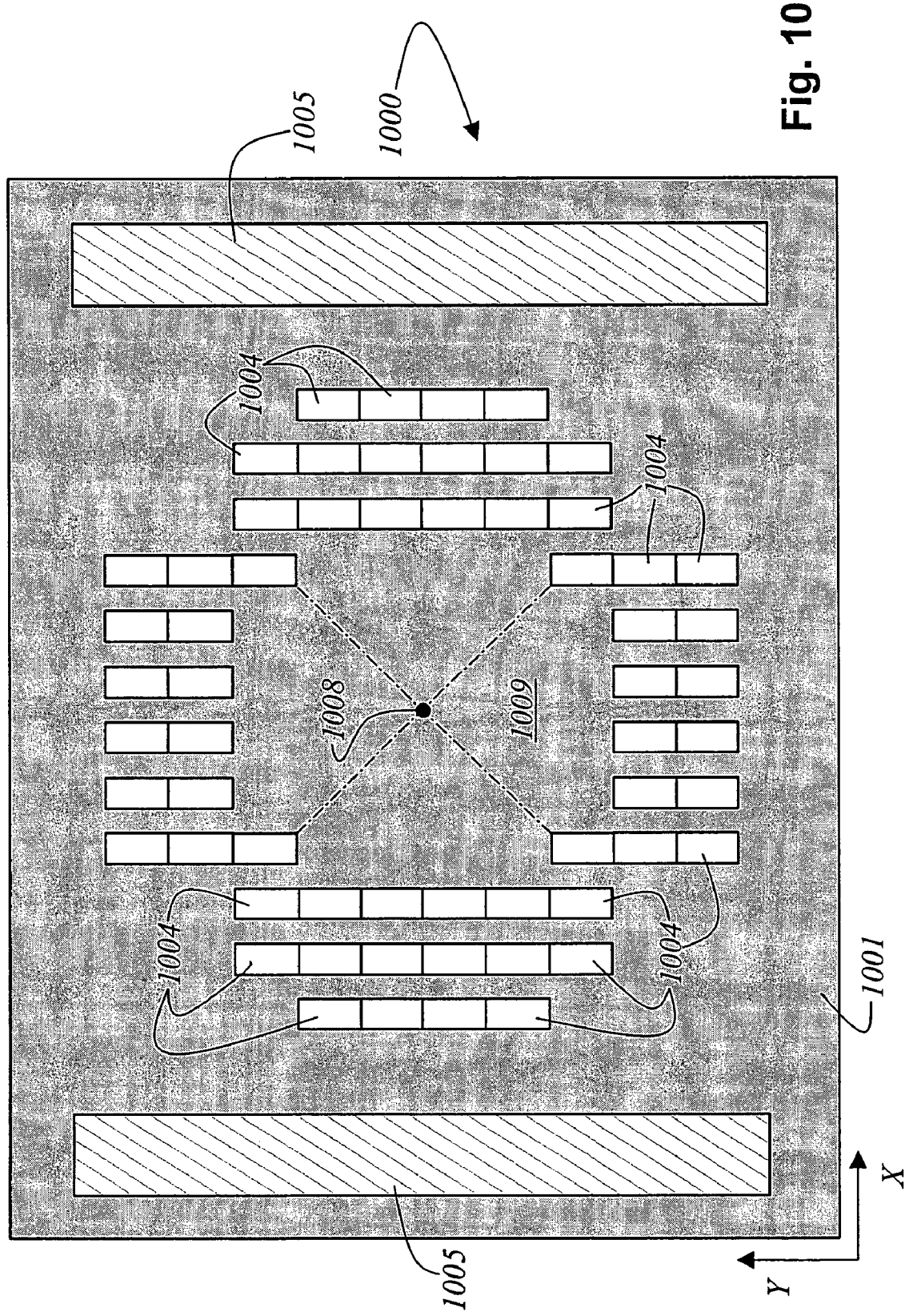
FIG. 10 shows a schematic view of an active aperture plate according to another embodiment form in which the aperture groups are configured on a chip.

FIG. 10 is a schematic view showing a complete active aperture plate 1000 according to another embodiment form. The size of a chip 1001 on which the aperture plate 1000 is realized is 66 mm×52 mm. Control electronics 1005 are provided, respectively, at opposite sides on the chip 1001. The individual aperture row groups 1004 are arranged on the chip 1001 of the active aperture plate 1000 around a center of symmetry 1008. The area 1009 around the center of symmetry 1008 is free from any structuring. In the embodiment example shown in FIG. 10, the number k of openings in every aperture row is 128. The distance between two openings within a row is five cells or pitch distance p (p=6). An aperture row group 1004 can have, e.g., 128 aperture rows which are offset by 6 W in Y-direction. Accordingly, all of the sixty aperture row groups 1004 shown in the drawing together contain 7680 aperture rows with 128 openings, respectively. For reasons of efficient data transmission, it may be useful to increase the quantity of aperture rows, e.g., to 8192, which can be carried out by arranging additional aperture row groups or by increasing the quantity of aperture rows per aperture row group.

Figure 11:
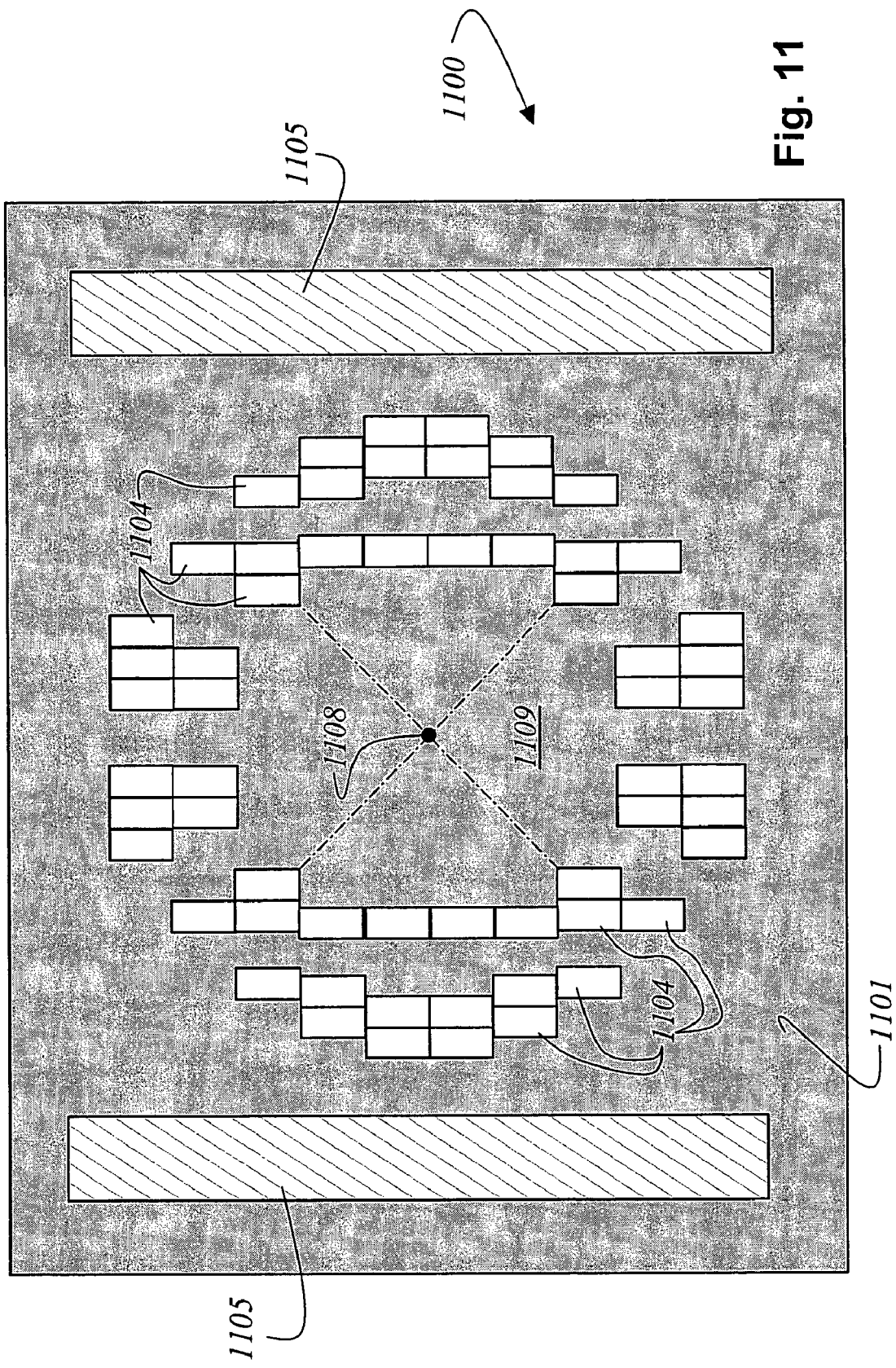
FIG. 11 shows a schematic view of an active aperture plate according to another embodiment form in which the aperture groups are configured on a chip.

FIG. 11 is a schematic view showing an active aperture plate 1100 according to another embodiment form. The size of a chip 1101 on which the aperture plate 1100 is realized is 66 mm×52 mm. Control electronics 1105 are provided, respectively, at opposite sides on the chip 1101. The individual aperture row groups 1104 are arranged on the chip 1101 of the aperture plate 1100 around a center of symmetry 1108. The area 1109 around the center of symmetry 1108 is free from any structuring. In the embodiment example shown in FIG. 11, the number k of openings in every aperture row is 128. The distance between two openings within a row is five cells or pitch distance p (p=6). An aperture row group 1104 can have, e.g., 128 aperture rows which are offset by 6 W in Y-direction.

Figure 12:
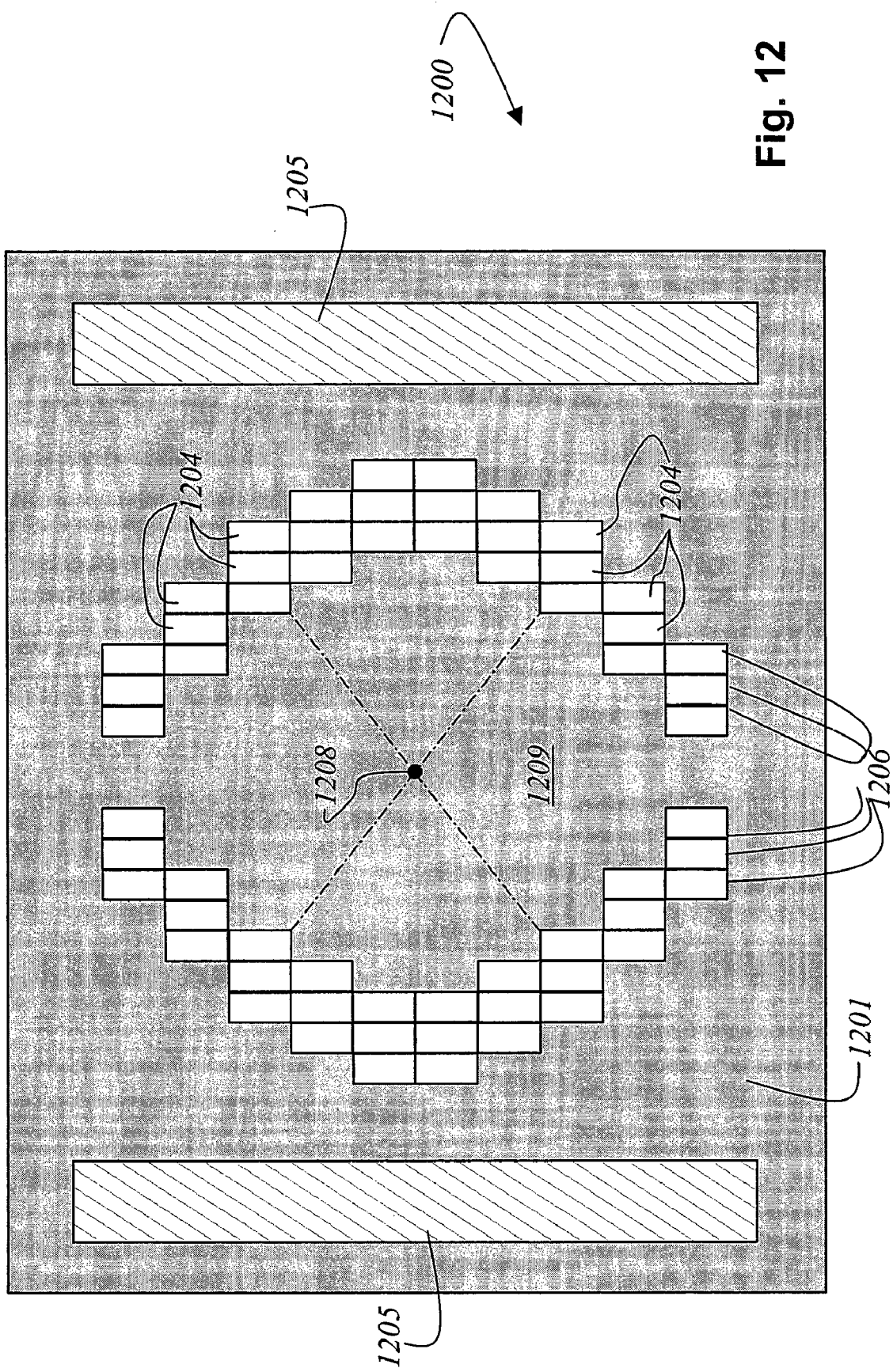
FIG. 12 shows a schematic view of an active aperture plate according to another embodiment form in which the aperture groups are configured on a chip.

FIG. 12 is a schematic view showing an active aperture plate 1200 according to another embodiment form. The size of a chip 1201 on which the aperture plate 1200 is realized is 66 mm×52 mm. Control electronics 1205 are provided, respectively, at opposite sides on the chip 1201. The individual aperture row groups 1204 are arranged on the chip 1201 of the aperture plate 1200 around a center of symmetry 1208. The area 1209 around the center of symmetry 1208 is free from any structuring. In the embodiment example shown in FIG. 12, the number k of openings in every aperture row is 128. The distance between two openings within a row is five cells or pitch distance p (p=6). An aperture row group 1204 can have, e.g., 128 aperture rows which are offset by 6 W in Y-direction. Here also, the Y-offset of the six aperture row groups within an X-line 1206 is between 1 W and 5 W.

Another important aspect in the selection of the position of the openings in the individual aperture plates and the position of the beginning of the aperture rows consists in minimizing imaging errors. It is known from conventional optics that these errors increase sharply as the radial distance of the partial beams from the beam axis increases. Therefore, the rectangular array structure notwithstanding, it is useful to choose a configuration of the aperture plate which substantially avoids partial beams in the corner areas as is shown in different ways in FIGS. 7, 8, 9, 10, 11 and 12 by way of example. Due to the fact that, in practice, a certain minimum distance must be maintained between the modulator elements and because, on the other hand, a compact construction is preferable for reasons of space and optical transparency of the arrangement, a basic variant consists in a uniform array arrangement such as is suggested in various publications.

Figure 13:
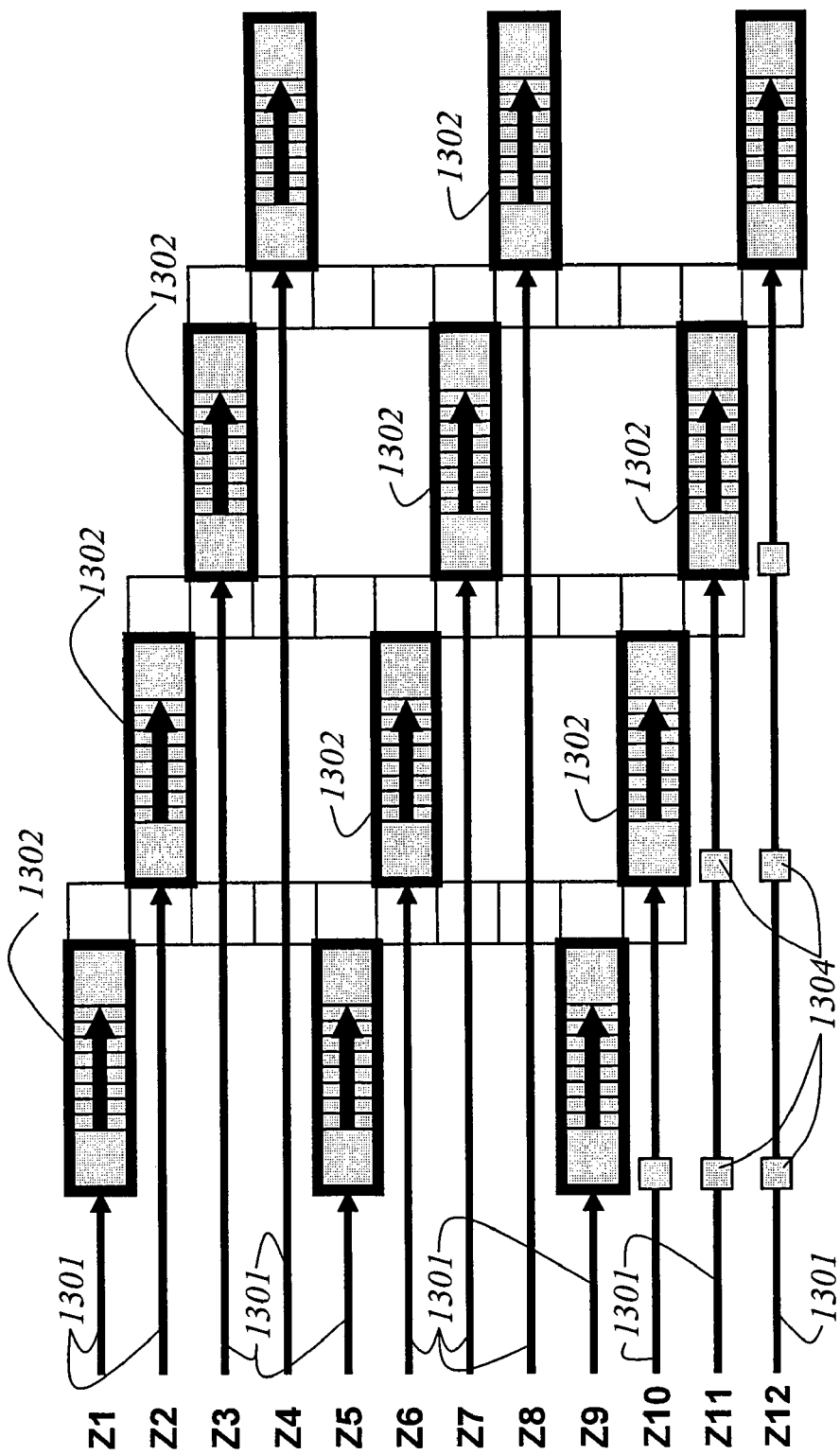
FIG. 13 shows an arrangement of the shift registers on the active aperture plate according to the invention.

The control (supply of dose information) of every aperture row is carried out directly at the start of the aperture row so that the respective X-offset relative to the start of the row and relative to the actuating electronics is bridged by conductors. A few shift registers 1302 or other signal shaping circuitry 1304 can be connected therebetween (see FIG. 13) to ensure signal quality. The correct data reference can be produced electronically by correspondingly providing the dose data and time-delayed readout of the row information.

The shift register array m×n corresponds to a pixel field of size m×n on the substrate or target 6. The data feed is effected out via lines 1301 having a bit width b. Likewise, every shift register stage must have a bit width b so that $2^b$ different dose values D can be coded. By using the above-described scan in row direction, which proceeds exactly synchronous with the clock shift, it is possible to associate a pixel position on the substrate with every dose value D traversing a corresponding shift row. Since every aperture row has m shift positions, it is possible in theory to actuate m different modulator elements successively with each dose value D. These modulator elements must be arranged in such a way that the associated partial beams are imaged through the projection optics in timed sequence on one and the same substrate pixel—ideally, at regular intervals on a line, realistically, on a curved line which compensates for the distortions of the imaging optics.

For reasons of space, it is impossible to arrange a modulator element in every row at every shift position; on the other hand, this is also unnecessary. In order to achieve the desired dose staggering, k (typically 64 . . . 512) identical modulator elements are sufficient: $2^b-1 \leq k < m$. This makes it possible to select k positions from m in every aperture row taking into account the relationship between the shift step and the beam position.

This provides the foundation for the construction of a multibeam modulator based on a shift register array of n rows and m shift stages, wherein k modulator elements can be arranged electively at k of m positions in every row.

In practical implementation, of course, all shift stages which would follow after the final modulator element in every row can be omitted because the dose value information is no longer needed. Also, the shift stages in front of the first modulator element of a row can be omitted when the data feed is carried out with an appropriate clock delay.

Figure 14:
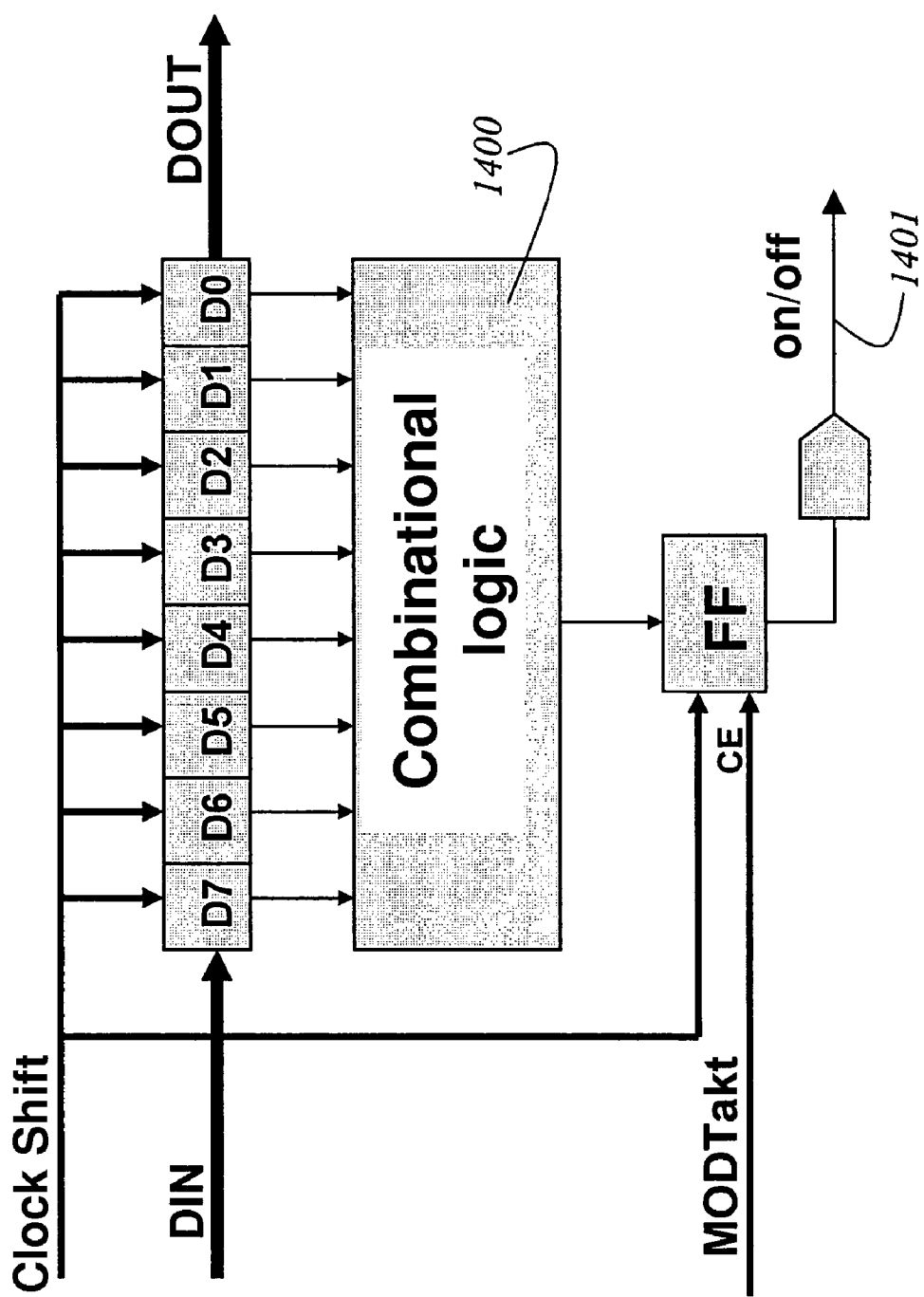
FIG. 14 illustrates a suggestion in which a combinational logic circuit is associated with each modulator element.

Another advantage of the proposed invention consists in that not only is on/off information is shifted through the rows of the active aperture plate or modulator array, but also grayscale information with a bit width b (typically 6 . . . 8 bits). This offers multifold possibilities for controlling the modulator elements. FIG. 14 shows a suggestion in which a combinational logic circuit 1400 is associated with every modulator element 1401. By means of the signal at the output of the logic circuit 1400, it is decided whether the modulator element 1401 switches the partial beam on or off. Accordingly, it is decided based on the upcoming dose value D whether or not the partial beam is switched on at the time of the transfer clock MODTakt. For example, of the k logic circuits of the k modulator elements of a row, exactly one at D>0, one at D>1, etc. up to exactly one at D>k−1 can supply "partial beam on" as a result so that k dose values can be realized. Any other logical operations of the bits of D are possible. Due to the fact that the logic circuits can be selectively associated with the modulators of a row, it is possible to choose a variant which produces a laterally homogeneous beam distribution for all dose values.

Figure 15:
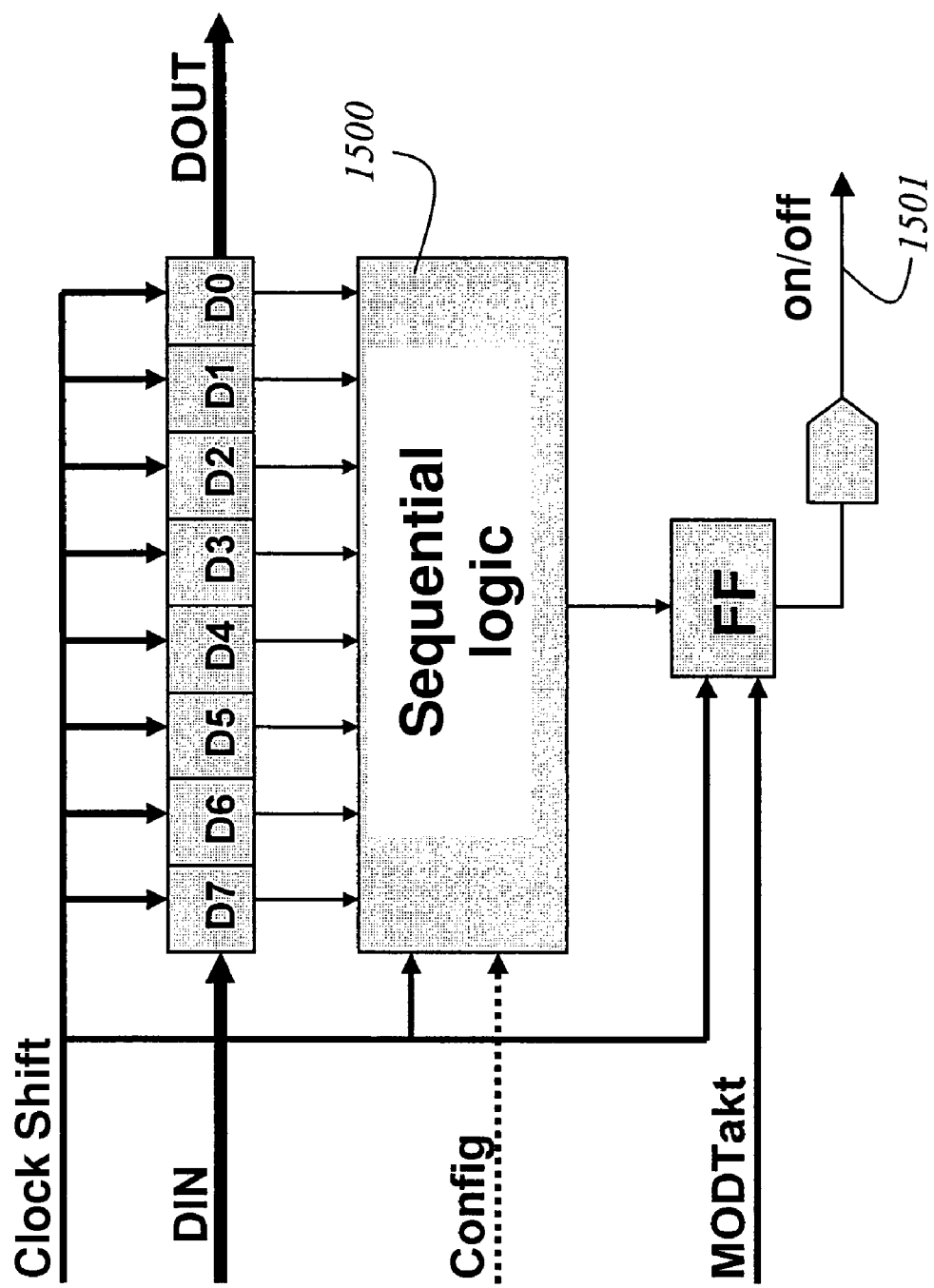
FIG. 15 illustrates a suggestion in which the modulator elements are controlled by a configurable logic.

Further, it is suggested to provide all or some of the logic circuits with s internal storage cells so that the combinational logic becomes a sequential logic 1500 (depending on the prior history because it has a "memory"). The storage cells are used as an s-bit configuration storage which must be loaded prior to the exposure. When s<=b, the loading can be carried out in such a way that determined bits of the upcoming dose value D are taken over in the configuration when a configuration signal Config is activated (FIG. 15). Even with one configuration bit (s=1), it is possible to activate a determined modulator element (it participates in the control of the partial beam depending on its logic) or to deactivate a determined modulator element (modulator is always in the "off" state). Increasing s results in a great number of possibilities for varying the control logic, although this also increases expenditure on circuitry.

The ability to reconfigure the modulator electronically gives rise to the following novel possibilities. Error redundancy is made possible so that, in the event of a failure of individual modulator elements, some modulator elements which were deliberately provided in the layout as reserves can simply be activated. Likewise, it is possible to adapt the exposure rows with respect to dose. This is carried out by adapting the number of active modulators, and variations in dosage between the exposure rows can accordingly be compensated (compensation of illumination inhomogeneities).

Figure 16:
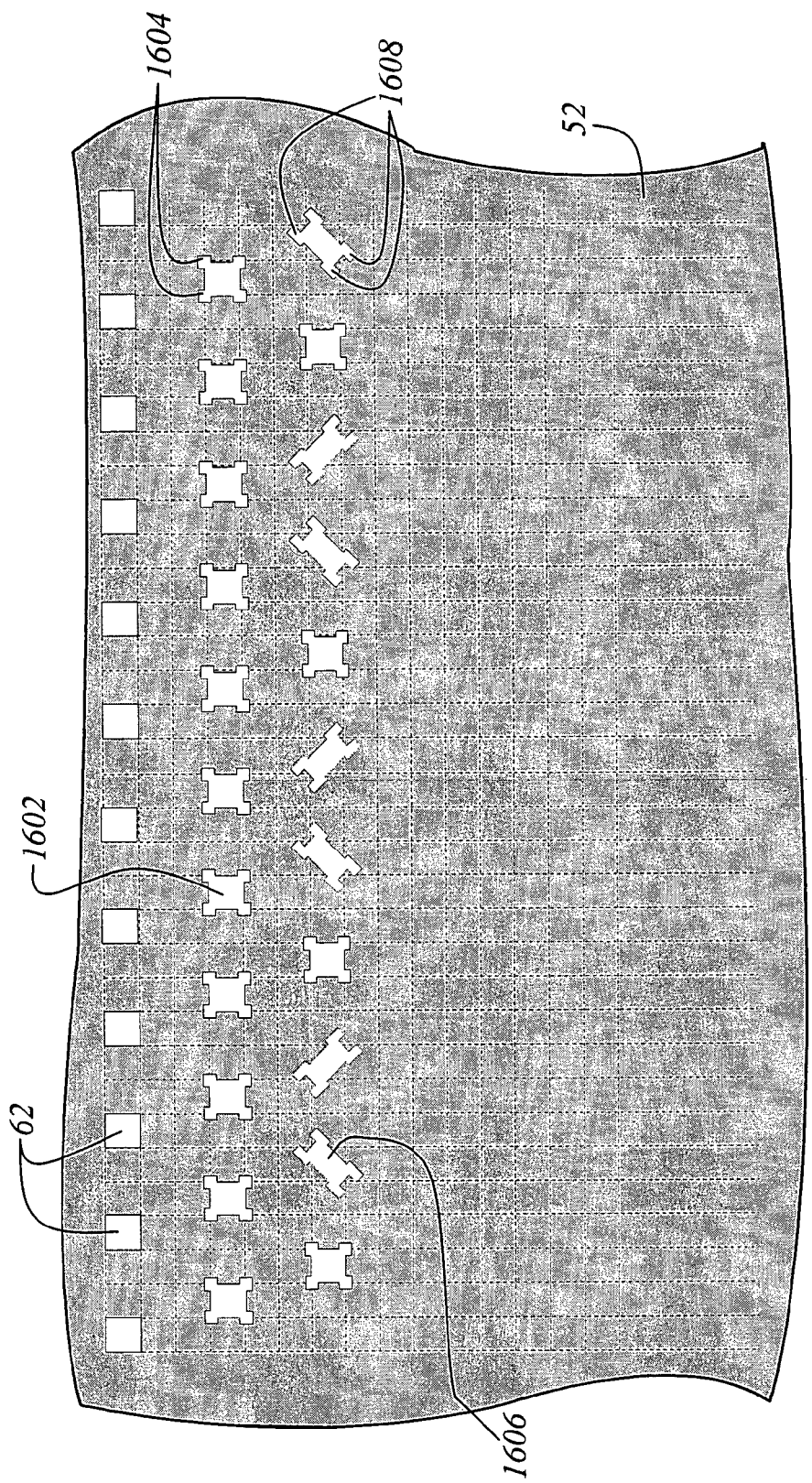
FIG. 16 shows a modification of the geometry of the openings in the aperture plate.

FIG. 16 shows a modification of the geometry of the openings in the second aperture plate 52. The uniform, square openings 62 are not modified. When the openings are produced in the aperture plate, corners can be rounded to deform the cross section of the partial beam. This can be partly compensated by a defined pre-distortion of the geometry of the openings in the aperture plate 52. In this connection, FIG. 16 shows simple examples for modifying the geometry of the openings. In a first variant, the openings 1602 have a square cross section with an additional small opening 1604 formed at each corner of the square. The entire geometry of the cross section of the opening extends beyond the dimension of a cell of the aperture plate 52.

In another possible modification of an opening 1606 in the aperture plate, the opening 1606 is a rectangle which is oriented diagonally with respect to a cell. Additional small rectangular openings 1608 are formed at the corners of the rectangle. As is shown in FIG. 16, the shape of the openings can change within a row. The above-mentioned ability to configure the modulator elements within an aperture row on the active aperture plate makes it possible, depending on the specific exposure task, to activate individual, particularly well-suited partial beam cross sections 1606 and deactivate other, less suitable partial beam cross sections. The rectangular beam cross sections, shown by way of example, which are rotated by 45° or 135° could help to reduce the edge roughness during the exposure of diagonal lines. Also, special partial beam cross sections can be introduced for optimizing the exposure of any curved structures or special structures.

While the foregoing description and drawings represent the present invention, it will be obvious to those skilled in the art that various changes may be made therein without departing from the true spirit and scope of the present invention.

What is claimed is:

1. A multibeam modulator which generates a plurality of individual beams from a particle beam, the particle beam illuminating said multibeam modulator at least partially over a surface thereof, said multibeam modulator comprising:
   a plurality of openings having equal size, each opening being arranged in a cell of a matrix of m×n cells;
   wherein the matrix comprises:
      a number m of matrix columns, each with a number n of cells; and
      a number n of matrix rows, each with a number m of cells and a number k of openings;
   wherein a size of each cell of the matrix is equal to the size of one of the openings, such that each opening occupies the entire cell in which each opening is arranged;
   wherein all of the openings in each matrix row form an aperture row within a limited portion of each matrix row, such that a number of cells of each aperture row is less than the number m of cells of each matrix row;
   wherein the density of the k openings within each matrix row is inhomogeneously distributed; and wherein a distance between the k openings of a single matrix row is equal to an integer multiple of the size of one of the cells.

2. The multibeam modulator according to claim 1;
wherein the openings within each matrix row are evenly spaced, wherein the distance between the openings measured in cells is less than the quotient of the number m of cells of each matrix row and the number k of openings within each matrix row.

3. The multibeam modulator according to claim 2;
wherein the number k of openings within each matrix row is between 64 and 512.

4. The multibeam modulator according to claim 1;
wherein the number m of cells in each matrix row is 4096.

5. The multibeam modulator according to claim 1;
wherein 3 to 7 cells are provided between the openings within each matrix row.

6. The multibeam modulator according to claim 1;
wherein the cells have a square shape and correspond to a pixel to be written on a target.

7. The multibeam modulator according to claim 1;
wherein a plurality of aperture rows combine to form aperture row subgroups, and a plurality of aperture row subgroups form an aperture row group.

8. The multibeam modulator according to claim 7;
wherein six aperture rows combine to form aperture row subgroups.

9. The multibeam modulator according to claim 8;
wherein neighboring aperture row groups in row direction are offset in each instance by 684 cells in row direction and 1 to 5 cells orthogonal to the row direction.

10. The multibeam modulator according to claim 8;
wherein the aperture row groups are offset inhomogeneously.

11. The multibeam modulator according to claim 1;
wherein a plurality of aperture row groups combine to form aperture groups and are uniformly arranged on a chip of an aperture plate.

12. The multibeam modulator according to claim 11;
wherein the aperture groups are arranged symmetrically around a center.

13. The multibeam modulator according to claim 11;
wherein at least one electronic circuit is structured on the active aperture plate.

14. The multibeam modulator according to claim 13;
wherein at least one electronic circuit supplies data to the shift registers formed on the aperture plate.

15. The multibeam modulator according to claim 14;
wherein a shift register chain is associated with each aperture row, which shift register chain provides for a synchronous shifting of the input data from cell to cell from the first aperture opening to the final aperture opening of every aperture row.

16. The multibeam modulator according to claim 15;
wherein grayscale information of bit width 1 to b is provided to the modulator elements of the multibeam modulator by the shift registers, where b is between 6 bits and 8 bits.

17. The multibeam modulator according to claim 16;
wherein a combinational logic is provided in addition to the shift registers of the aperture rows per aperture to obtain the on/off signal from the grayscale information.

18. The multibeam modulator according to claim 16;
wherein a sequential logic circuit is provided in addition to the shift registers of the aperture rows per aperture to obtain the on/off signal from the grayscale information.

19. The multibeam modulator according to claim 18;
wherein the shift register of the grayscale information is used for programming the sequential logic circuit and a suitable "Config" signal network is implemented in addition.

20. The multibeam modulator according to claim 11;
wherein the aperture groups are separated by webs on which no structuring with apertures is carried out.

21. The multibeam modulator according to claim 20;
wherein the webs are parallel.

22. A method of using a multibeam modulator for maskless structuring of substrates, comprising the steps of:
generating a plurality of individual beams in that a particle beam illuminates the multibeam modulator at least partially over its surface; and
forming a plurality of equally sized openings in the multibeam modulator, such that each opening is arranged in a cell of a matrix of m×n cells;
wherein the matrix comprises:
a number m of matrix columns, each with a number n of cells; and
a number n of matrix rows, each with a number m of cells and a number k of openings;
wherein a size of each cell of the matrix is equal to the size of one of the openings, such that each opening occupies the entire cell in which each opening is arranged;
wherein all of the openings in each matrix row form an aperture row within a limited portion of each matrix row, such that a number of cells of each aperture row is less than the number m of cells of each matrix row;
wherein the density of the k openings within each matrix row is inhomogeneously distributed; and
wherein a distance between the k openings of a single matrix row is equal to an integer multiple of the size of one of the cells.

* * * * *